(12) United States Patent
Kimura

(10) Patent No.: US 10,440,826 B2
(45) Date of Patent: Oct. 8, 2019

(54) SEMICONDUCTOR DEVICE

(71) Applicant: Toshiba Memory Corporation, Tokyo (JP)

(72) Inventor: Daisuke Kimura, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/694,972

(22) Filed: Sep. 4, 2017

(65) Prior Publication Data

US 2018/0270956 A1  Sep. 20, 2018

(30) Foreign Application Priority Data

Mar. 17, 2017  (JP) .................. 2017-053461

(51) Int. Cl.
H05K 5/00 (2006.01)
H05K 1/18 (2006.01)
(Continued)

(52) U.S. Cl.
CPC ......... H05K 1/181 (2013.01); H01L 25/0657 (2013.01); H01L 25/18 (2013.01); H05K 1/111 (2013.01); H05K 1/117 (2013.01); H05K 3/3436 (2013.01); *H01L 24/32* (2013.01); *H01L 24/48* (2013.01); *H01L 24/73* (2013.01); *H01L 2224/32145* (2013.01); *H01L 2224/32225* (2013.01); *H01L 2224/33181* (2013.01);
(Continued)

(58) Field of Classification Search
CPC ........ H05K 1/181; H05K 1/111; H05K 1/117; H05K 1/11; H05K 1/16; H05K 1/18; H05K 1/182; H05K 2201/09372; H05K 2201/094; H05K 2201/09409; H01L 25/0657; H01L 25/18; H01L 24/32; H01L 24/48; H01L 24/73
USPC ............... 361/743, 790, 735, 760, 764, 767, 361/772–774, 777, 782–785, 803; 174/260
See application file for complete search history.

(56) References Cited

U.S. PATENT DOCUMENTS

| | | | |
|---|---|---|---|
| 2015/0243593 A1* | 8/2015 | Marbella ........... | H01L 23/49816 257/738 |
| 2016/0037643 A1* | 2/2016 | Kim ...................... | H05K 1/111 361/767 |
| 2018/0098420 A1* | 4/2018 | Kariyazaki et al. .... | H01L 23/32 |

FOREIGN PATENT DOCUMENTS

JP  2011-029298 A  2/2011

* cited by examiner

*Primary Examiner* — Binh B Tran
(74) *Attorney, Agent, or Firm* — Kim & Stewart LLP

(57) ABSTRACT

A semiconductor device includes a mounting substrate including an interface, which is connectable with a host, a surface-mounted component mounted on the mounting substrate and having first and second electrode groups, a first solder portion that is positioned between a first electrode in the first electrode group and the mounting substrate to electrically connect the first electrode and the mounting substrate, and a second solder portion that is positioned between a second electrode in the second electrode group and the mounting substrate to electrically connect the second electrode and the mounting substrate. The second solder portion has a larger contact area with the mounting substrate than the first solder portion. The second solder portion is positioned between at least one additional second electrode (Continued)

in the second electrode group to electrically connect the at least one additional second electrode and the mounting substrate.

18 Claims, 7 Drawing Sheets

(51) Int. Cl.
*H05K 1/11* (2006.01)
*H01L 25/18* (2006.01)
*H01L 25/065* (2006.01)
*H05K 3/34* (2006.01)
*H05K 7/00* (2006.01)
*H01L 23/00* (2006.01)
*H05K 3/30* (2006.01)

(52) U.S. Cl.
CPC ............... *H01L 2224/48106* (2013.01); *H01L 2224/48225* (2013.01); *H01L 2224/73265* (2013.01); *H01L 2225/0651* (2013.01); *H01L 2225/06586* (2013.01); *H01L 2225/06589* (2013.01); *H01L 2924/1436* (2013.01); *H01L 2924/1443* (2013.01); *H01L 2924/14511* (2013.01); *H05K 3/305* (2013.01); *H05K 2201/10159* (2013.01); *H05K 2201/10522* (2013.01); *H05K 2201/10719* (2013.01); *H05K 2201/10734* (2013.01)

FIG. 8

| ELECTRODE NUMBER | NAME OF FUNCTION | ELECTRODE NUMBER | NAME OF FUNCTION | ELECTRODE NUMBER | NAME OF FUNCTION | ELECTRODE NUMBER | NAME OF FUNCTION | ELECTRODE NUMBER | NAME OF FUNCTION |
|---|---|---|---|---|---|---|---|---|---|
| A1 | GND | B1 | GND | C1 | SIGNAL a | D1 | GND | E1 | GND |
| A2 | GND | B2 | SIGNAL b | C2 | SIGNAL c | D2 | SIGNAL d | E2 | GND |
| A3 | SIGNAL e | B3 | SIGNAL f | C3 | SIGNAL g | D3 | SIGNAL h | E3 | SIGNAL q |
| A4 | GND | B4 | SIGNAL i | C4 | SIGNAL j | D4 | SIGNAL k | E4 | GND |
| A5 | GND | B5 | GND | C5 | SIGNAL l | D5 | GND | E5 | GND |

SEMICONDUCTOR DEVICE

This application is based upon and claims the benefit of priority from Japanese Patent Application No. 2017-053461, filed Mar. 17, 2017, the entire contents of which are incorporated herein by reference.

FIELD

Embodiments described herein relate generally to a semiconductor device.

BACKGROUND

Recently, a solid state device (SSD) in which a large-capacity memory device such as a hard disk drive (HDD) is replaced with a flash memory is developed. In an SSD, for example, a ball-grid-array (BGA) type semiconductor package in which a system-in-package (SiP) type module or a semiconductor chip is sealed with a resin is mounted.

DESCRIPTION OF THE DRAWINGS

FIG. 8 illustrates a table in which the numbers of the first electrodes and the second electrodes of the semiconductor device according to the first embodiment are associated with functions thereof.

DETAILED DESCRIPTION

Figure 1A:
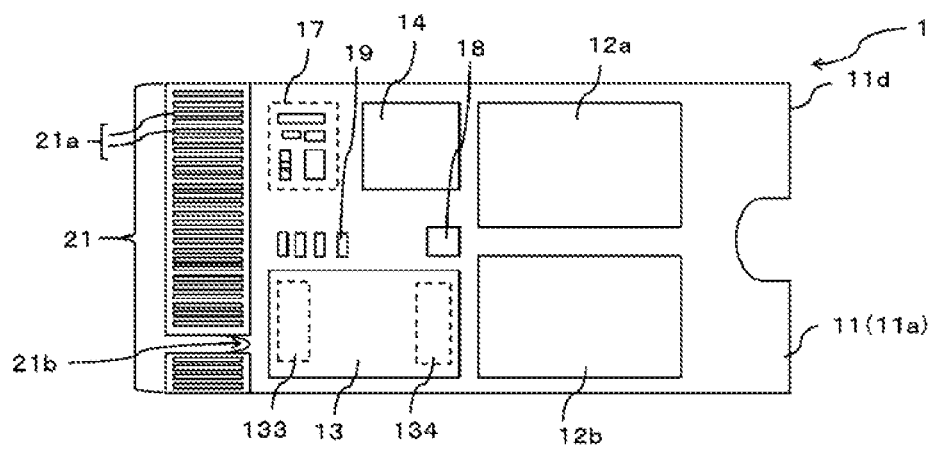
FIG. 1A is a top view illustrating an external appearance of a semiconductor device according to a first embodiment.

Embodiments provide a semiconductor device that is improved in mounting reliability.

In general, according to one embodiment, a semiconductor device includes a mounting substrate including an interface, which is connectable with a host, a surface-mounted component mounted on the mounting substrate and having electrode groups including a first electrode group having a plurality of first electrodes and a second electrode group having a plurality of second electrodes, a first solder portion that is positioned between a first electrode in the first electrode group and the mounting substrate to electrically connect the first electrode and the mounting substrate, and a second solder portion that is positioned between a second electrode in the second electrode group and the mounting substrate to electrically connect the second electrode and the mounting substrate. The second solder portion has a larger contact area with the mounting substrate than the first solder portion. The second solder portion is positioned between at least one additional second electrode in the second electrode group to electrically connect the at least one additional second electrode and the mounting substrate.

Hereinafter, embodiments will be described with reference to the drawings. In the following description, the same components will be represented by the same reference numerals, and description of components described once will not be repeated as appropriate.

The drawings are schematic or conceptual, in which a relationship between the thickness and the width of each component, a ratio between the sizes of components, and the like are not necessarily the same as the actual ones. In addition, in a case where the same component is illustrated in different drawings, a dimension or a ratio of the component may vary depending on the drawings.

First Embodiment

Figure 1B:
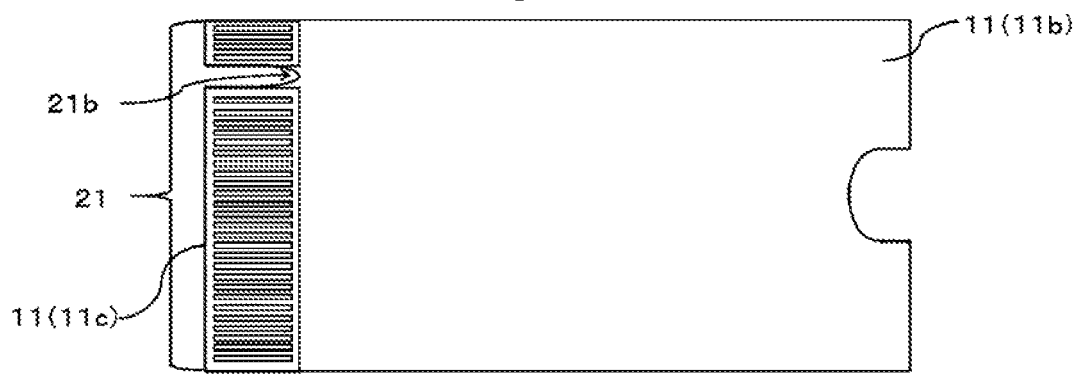
FIG. 1B is a bottom view illustrating the external appearance of the semiconductor device according to the first embodiment.
Figure 1C:
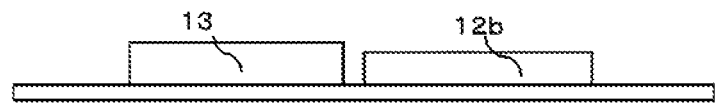
FIG. 1C is a side view illustrating the external appearance of the semiconductor device according to the first embodiment.
Figure 2:
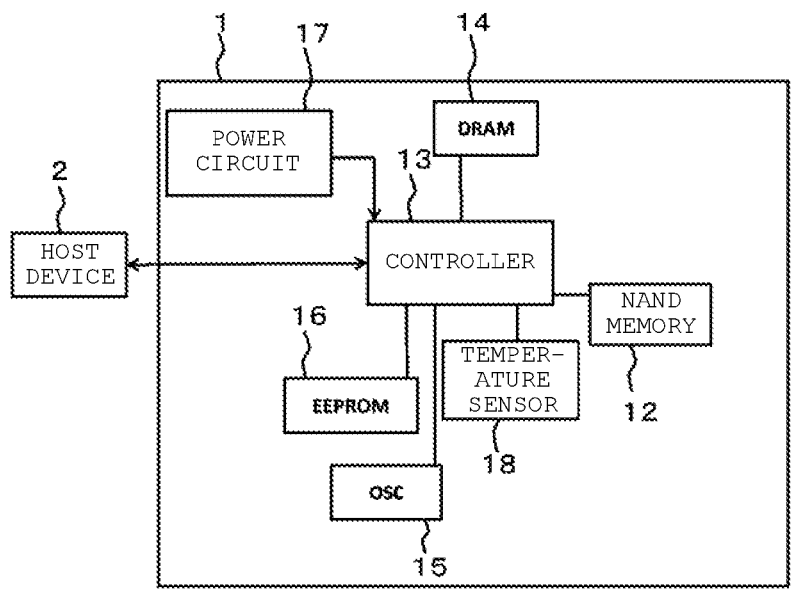
FIG. 2 is a diagram illustrating an example of a system configuration of the semiconductor device according to the first embodiment.

A first embodiment of the present disclosure will be described with reference to FIGS. 1A to 1C. FIGS. 1A to 1C illustrate external appearances of a semiconductor device 1 according to the first embodiment. FIG. 1A is a top view, FIG. 1B is a bottom view, and FIG. 1C is a side view. In addition, FIG. 2 illustrates an example of a system configuration of the semiconductor device 1 according to the first embodiment. As illustrated in FIG. 2, the semiconductor device 1 is connected to a host device 2. The host device 2 is, for example, a portable computer.

As illustrated in FIGS. 1A to 1C, the semiconductor device 1 includes a mounting substrate 11, a NAND flash memory (hereinafter, abbreviated as "NAND memory") 12 (depicted as NAND memory 12a and NAND memory 12b) as a nonvolatile semiconductor memory element, a controller 13, a dynamic random access memory (DRAM) 14 as a volatile semiconductor memory element which can store data with a higher speed than that of the NAND memory 12, an oscillator (OSC) 15, an electrically erasable and programmable ROM (EEPROM) 16, a power circuit 17, a temperature sensor 18, and other electronic components 19 such as a resistor or a capacitor.

The NAND memory 12 or the controller 13 according to the first embodiment is mounted as part of a semiconductor package that is an electronic component. For example, the semiconductor package including the NAND memory 12 is a system-in-package type module, and a plurality of semiconductor chips is sealed in this single semiconductor package. The controller 13 controls an operation of the NAND memory 12.

The mounting substrate 11 is, for example, a substantially rectangular wiring board formed of a material such as a glass epoxy resin, and defines external dimensions of the semiconductor device 1. The mounting substrate 11 includes a first surface 11a, and a second surface 11b that is positioned opposite to the first surface 11a. In this specification, among the surfaces constituting the mounting substrate 11, a surface other than the first surface 11a and the second surface 11b is defined as "side surface" of the mounting substrate 11.

In the semiconductor device 1, the first surface 11a is a component mounting surface on which the NAND memory 12, the controller 13, the DRAM 14, the oscillator 15, the EEPROM 16, the power circuit 17, the temperature sensor 18, and the other electronic components 19 such as a resistor or a capacitor are mounted.

On the other hand, the second surface 11b of the mounting substrate 11 according to the embodiment is a component non-mounting surface on which the components are not mounted. This way, a plurality of components, which are formed separately from the mounting substrate 11, is disposed on one surface of the mounting substrate 11. As a result, the components can be made to protrude from only one surface of the mounting substrate 11. Thus, the thickness of the semiconductor device 1 can be reduced, as compared to a case where the components protrude from both the first surface 11a and the second surface 11b of the mounting substrate 11.

As illustrated in FIGS. 1A to 1C, the mounting substrate 11 includes a first edge portion 11c, and a second edge portion 11d that is positioned opposite to the first edge portion 11c. The first edge portion 11c includes an interface portion 21 (a substrate interface portion, a terminal portion, and a connection portion). The interface portion 21 is not necessarily provided on the mounting substrate 11 and may be realized using a connector component. Here, even when the connector component is used, the configuration is regarded as the interface portion 21.

The interface portion 21 includes, for example, a plurality of connection terminals 21a. The interface portion 21 is electrically connected to the host device 2, for example, by being inserted into a connector (not illustrated) of the host device 2. The interface portion 21 exchanges signals (e.g., a control signal and a data signal) with the host device 2.

The interface portion 21 according to the embodiment is, for example, an interface conforming to the standard of PCI Express (hereinafter, PCIe). That is, high-speed signals (high-speed differential signal) conforming to the standard of PCIe flow between the interface portion 21 and the host device 2. The semiconductor device 1 receives the supply of power from the host device 2 via the interface portion 21.

In the interface portion 21 according to the embodiment, an interface conforming to another standard such as serial attached SCSI (SAS), serial advanced technology attachment (SATA), nonvolatile memory express (NVMe), or universal serial bus (USB) may be used instead of the interface conforming to the standard of PCIe.

In the interface portion 21, a slit 21b is formed at a position, which is offset from the center position of the mounting substrate 11 in a transverse direction, so as to be fitted to a protrusion portion or the like provided in a connector of the host device 2. As a result, reverse attachment of the semiconductor device 1 can be prevented.

The power circuit 17 is, for example, a DC-DC converter and generates a predetermined voltage, which is required for the semiconductor package or the like, from the power supplied from the host device 2.

The controller 13 controls an operation of the NAND memory 12. That is, the controller 13 controls writing, reading, and erasing of data on the NAND memory 12.

The DRAM 14 is an example of a volatile memory and is used, for example, for storing management information used in managing the NAND memory 12, or for caching data. As the DRAM 14, for example, another volatile memory such as SRAM may also be used.

The oscillator 15 supplies operation signals having a predetermined frequency to the controller 13. The EEPROM 16 stores a control program or the like as fixed information.

The temperature sensor 18 detects a temperature of the semiconductor device 1 and notifies the detected temperature to the controller 13. In the embodiment, one temperature sensor 18 is mounted on the mounting substrate 11, and the temperature of the semiconductor device 1 is monitored by the temperature sensor 18. The number of temperature sensors 18 is not necessarily one. For example, a plurality of temperature sensors 18 may be provided on the mounting substrate 11 so as to monitor temperatures of the semiconductor device 1 at a plurality of positions.

On the mounting substrate 11 according to the embodiment, plural kinds of electronic components including the NAND memory 12, the controller 13, and the DRAM 14 are mounted. The temperatures of the electronic components vary depending on the operating state of the semiconductor device 1, loads applied to the respective electronic components, or the like. Therefore, to be exact, the temperature of the semiconductor device 1 is not uniform.

Therefore, in the embodiment, "the temperature of the semiconductor device 1" is defined as a temperature measured at a position where the temperature sensor 18 is mounted. In other words, "the temperature of the semiconductor device 1" described in the embodiment refers to the peripheral temperature of the position where the temperature sensor 18 is mounted.

Further, the temperature sensor 18 is not necessarily provided on the mounting substrate 11 and may be provided as one of the functions of the controller 13.

In addition, the temperature sensor 18 may be mounted inside the semiconductor package such as the NAND memory 12 or the controller 13, or may be bonded to a surface of the semiconductor package. In this case, the temperature sensor 18 can measure the temperature of the NAND memory 12 or the temperature of the controller 13 with higher accuracy than a case where the temperature sensor 18 is mounted on the mounting substrate 11.

In this embodiment, the number of NAND memories 12, the mounting position thereof, and the like are not particularly limited to the example illustrated in the drawings. For example, in the embodiment, an example where two NAND memories 12 (12a and 12b) are mounted on the first surface 11a of the mounting substrate 11 is described. However, for example, the number of NAND memories 12 is not limited to this example. The same applies to the DRAM 14.

Figure 3:
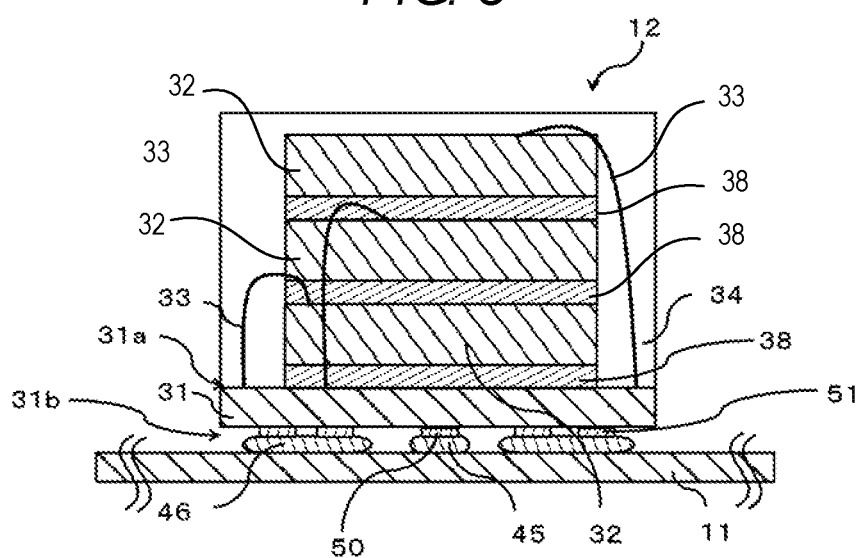
FIG. 3 is a cross-sectional view illustrating the semiconductor device according to the first embodiment in which a NAND memory is mounted.

FIG. 3 is a cross-sectional view illustrating the NAND memory 12 according to the first embodiment which is mounted on the mounting substrate 11. The NAND memory 12 includes a package substrate 31, a plurality of memory chips 32, bonding wires 33, a sealing portion (which is made of molding material) 34, mount films 38, a first electrode 50, a second electrode 51, a first solder portion 45, and a second solder portion 46.

The package substrate 31 has a front surface 31a and a rear surface 31b. In this embodiment, the NAND memory 12 includes the plurality of memory chips 32, the bonding wires 33, the sealing portion 34, and the mount films 38 on the front surface 31a of the package substrate 31. Further, the first electrode 50, the second electrode 51, the first solder portion 45, and the second solder portion 46 are positioned on the rear surface 31b of the package substrate 31.

The NAND memory 12 is mounted on the mounting substrate 11 of the semiconductor device 1. The mounting substrate 11 is, for example, a multi-layer wiring board, and includes a power supply layer, a GND layer, and an internal wiring which are not illustrated. The mounting substrate 11 is electrically connected to the plurality of memory chips 32 via the plurality of first solder portions 45, the plurality of first electrode 50, the package substrate 31, and the bonding wires 33.

In addition, the memory chip 32 is fixed onto the package substrate 31 by the mount film 38. Further, the plurality of memory chips 32 are fixed to each other by the mount films 38. That is, the plurality of memory chips 32 and the mount films 38 are alternately stacked on the front surface 31a of the package substrate 31. The second solder portion 46 will be described below in conjunction with the description of the controller 13.

Figure 4:
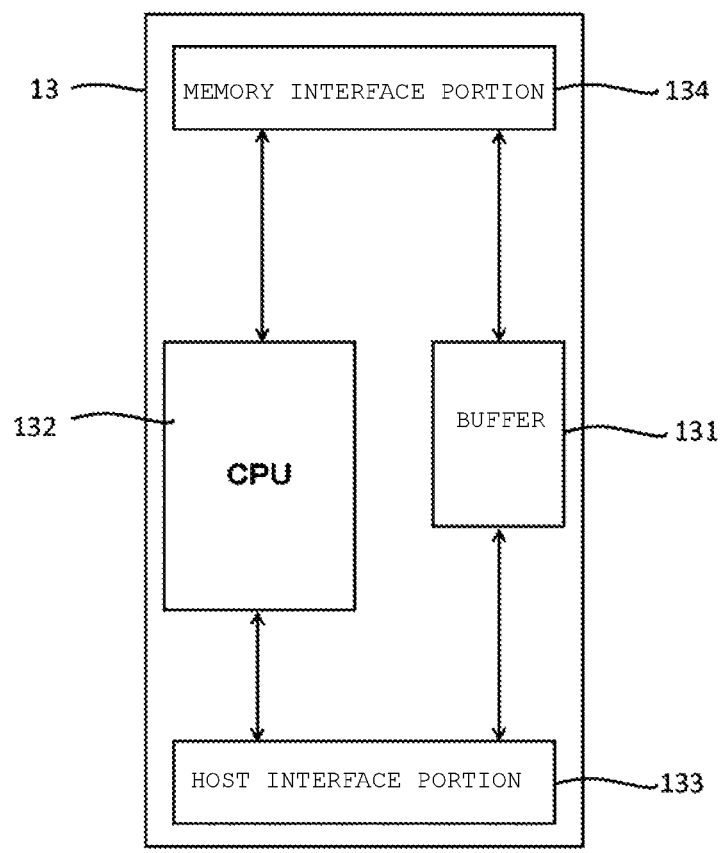
FIG. 4 is a diagram illustrating an example of a system configuration of a controller of the semiconductor device according to the first embodiment.

FIG. 4 illustrates an example of a system configuration of the controller 13. As illustrated in FIG. 4, the controller 13 includes, for example, a buffer 131, a central processing unit (CPU) 132, a host interface portion 133, and a memory interface portion 134.

As described above, the controller 13 may, for example, function as the temperature sensor 18 or function as the power circuit 17, and the system configuration of the controller 13 is not limited to the configuration illustrated in the FIG. 4.

When data sent from the host device 2 is written on the NAND memory 12, the buffer 131 temporarily stores a predetermined amount of data. In addition, when data read from the NAND memory 12 is sent to the host device 2, the buffer 131 temporarily stores a predetermined amount of data.

The CPU 132 performs the overall control of the semiconductor device 1. The CPU 132 receives a write command, a read command, or an erase command from, for example, the host device 2 so as to perform an access to the corresponding region of the NAND memory 12 or to control data transfer processing through the buffer 131.

The memory interface portion 134 is interposed between the interface portion 21 of the mounting substrate 11, and the CPU 132 and the buffer 131. The host interface portion 133 performs interface processing between the controller 13 and the host device 2. For example, high-speed signals conforming to PCIe flow between the host interface portion 133 and the host device 2.

For example, in a case where a command is sent from the host device 2, the interface portion 21 receives signals corresponding to the command from the host device 2, and exchanges signals with the host interface portion 133 of the controller 13 via a wiring pattern of the mounting substrate 11 and a first solder portion.

As shown in FIGS. 1 and 4, the memory interface portion 134 is positioned between the NAND memory 12, and the CPU 132 and the buffer 131. The memory interface portion 134 performs interface processing between the controller 13 and the NAND memory 12.

Signals from the controller 13 are sent from the memory interface portion 134 to the wiring pattern of the mounting substrate 11 via the first solder portions 45, and then are sent from the first solder portions 45 to the NAND memory 12.

Accordingly, the memory interface portion 134 is positioned between the NAND memory 12, and the CPU 132 and the buffer 131. As a result, the length of wiring between the memory interface portion 134 and the NAND memory 12 can be reduced, and the operational stability of the semiconductor device 1 can be improved.

Figure 5:
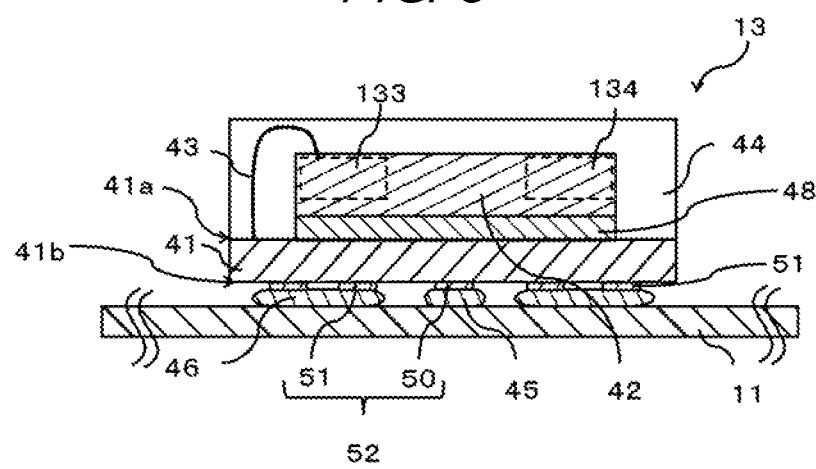
FIG. 5 is a cross sectional view illustrating of the controller according to the first embodiment which is mounted.

FIG. 5 is a cross sectional view of the controller 13 according to the first embodiment which is mounted on the mounting substrate 11. As illustrated in FIG. 5, the controller 13 includes a package substrate 41, a controller chip 42, a bonding wire 43, a sealing portion (which is made of molding material) 44, a mount film 48, a first electrode 50, a second electrode 51, a first solder portion 45, and a second solder portion 46.

The package substrate 41 has a front surface 41a and a rear surface 41b). In this embodiment, the controller 13 includes the controller chip 42, the bonding wire 43, the sealing portion 44, and the mount film 48 on the front surface 41a of the package substrate 41. Further, the first electrode 50, the second electrode 51, the first solder portion 45, and the second solder portion 46 are positioned on the rear surface 41b of the package substrate 41. In addition, the first electrode 50 and the second electrode 51 are collectively referred to as an electrode group 52.

Figure 6:
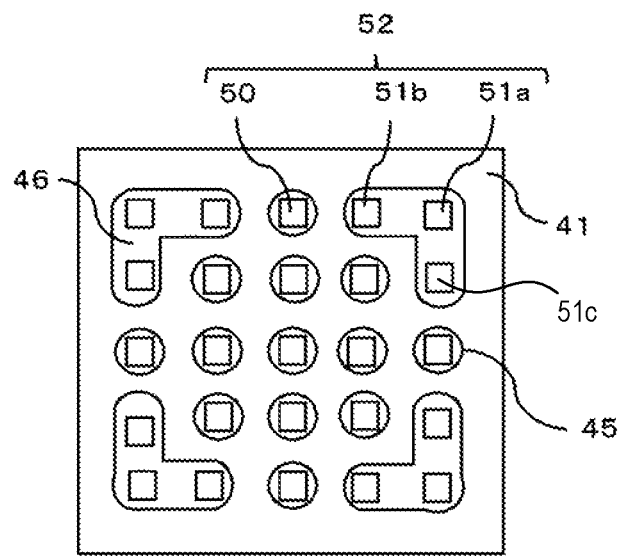
FIG. 6 is a top-view of the controller with the package substrate of the first embodiment depicted in a transparent manner so as to illustrate the positional relationship between electrodes and solder portions.

FIG. 6 is a top view of a case where the controller 13 according to the first embodiment is mounted on the mounting substrate 11. In FIG. 6, the configuration on the front surface 41a of the package substrate 41 and the mounting substrate 11 is not illustrated for convenience of description. Further, the package substrate 41 is transparently illustrated so as to easily recognize the positional relationship between the first solder portion 45, the second solder portion 46, the first electrode 50, and the second electrode 51 (depicted as second electrodes 51a, 51b, 51c, and hereinafter referred to as second electrodes 51).

As illustrated in FIGS. 3, 5, and 6, the NAND memory 12 and the controller 13 according to this embodiment are, for example, BGA-type packages, and are examples of semiconductor packages that have surface-mounted components. In the BGA-type package, generally, a plurality of electrodes (for example, the first electrodes 50 in this embodiment) are arranged in a lattice pattern on the rear surface of the package substrate (in this embodiment, for example, the rear surface 41b of the package substrate 41), and a solder ball (in this embodiment, for example, the first solder portion 45) is connected to each of the electrodes. The controller 13 will be described below as an example of a surface-mounted component according to this embodiment.

In the controller 13, the electrode groups 52 including the first electrode 50 and the second electrodes 51 are arranged in a lattice pattern on the rear surface 41b of the package substrate 41. A high-speed signal conforming to, for example, PCIe flows through the first electrode 50 between the controller 13 and the mounting substrate 11.

The first electrode 50 may be not only an electrode through which the signal conforming to the standard flows as described above, but also an electrode having a GND potential or a floating potential in part. Herein, the GND potential is a reference potential and the floating potential is a potential in a signal line or a control line. Further, one first electrode 50 is connected to one first solder portion 45. That is, one first solder portion 45 electrically connects one first electrode 50 and the mounting substrate 11 with each other.

On the other hand, each of the second electrodes 51 is an electrode to which a GND potential or a floating potential is applied. Further, the second electrodes 51 may be not only electrodes taking a GND potential or a floating potential, but at least, also electrodes through which the signal conforming to the standard flows.

The plurality of second electrodes 51 are connected to one second solder portion 46. In other words, the plurality of second electrodes 51 share one second solder portion 46. That is, one second solder portion 46 electrically connects the plurality of second electrodes 51 to the mounting substrate 11. A contact area between the second solder portion 46 and the mounting substrate is larger than a contact area between the first solder portion 45 and the mounting substrate. In other words, the maximum cross-sectional area of the second solder portion 46 is larger than that of the first solder portion in a direction parallel to the mounting surface 41b. Here, the number of the plurality of second electrodes 51 connected to one second solder portion are, for example, three as illustrated in FIG. 6, but may be two or four or more without being limited thereto.

Both of the first solder portion 45 and the second solder portion 46 may be electrically connected to the mounting substrate with a conductive element such as an electrode pad interposed therebetween. In this case, the conductive element is regarded as a part of the substrate.

In this embodiment, the second electrodes 51 are, for example, one of four sets of electrodes positioned at four corners of the outermost periphery, in the electrode group 52 arranged in the lattice pattern on the rear surface 41b of the package substrate 41. Here, the "electrodes of four corners" refer to electrodes positioned at each apex of a rectangle formed by the outermost periphery, in the electrode group 52 arranged in the lattice pattern on the rear surface 41b of the package substrate 41. In the following description, the "second electrode 51" positioned at the four corners of the rear surface 41b of the package substrate 41 is particularly referred to as a "second electrode 51a", and the other second electrodes 51 are referred to as "second electrodes 51b" and "third electrodes 51c".

The electrode groups 52 including the first electrode 50 and the second electrodes 51 are arranged in a lattice pattern on the rear surface 41b of the package substrate 41. Further, the plurality of first electrodes 50 are electrically connected the plurality of first solder portions 45, respectively. The plurality of second electrodes 51 are electrically connected in common to one second solder portion 46. As illustrated in FIG. 6, in this embodiment, four pairs of second solder portion 46 are electrically connected in common and the plurality of second electrodes 51 are formed including each of the second electrodes 51a positioned at four corners of the package substrate 41 described above. In this embodiment, as illustrated in FIG. 6, for example, three second electrodes 51 share one second solder portion 46.

Here, each second electrode 51 is not an electrode through which a signal conforming to the standard flows, as described above, but an electrode to which a GND potential or a floating potential is applied, for example. In general, the semiconductor package often includes elements (e.g., chips) that generate heat during electric current flows, thermal expansion and contraction are repeated due to repetitive turning on and off of the power supply, and thus the mounting substrate 11 or the semiconductor package itself may be distorted. From this distortion, cracks may occur in a soldered contact. Stress due to the thermal expansion and contraction may be intensively generated on four corners of the semiconductor package. For this reason, electrodes positioned at four corners of the semiconductor package are not generally used for signals in many cases. Therefore, even when these plural electrodes are electrically short-circuited, there is no problem in functioning as a semiconductor package in some cases.

In this embodiment, the second electrodes 51 are particularly set as the plural electrodes in which there is no problem in functioning as a semiconductor package even when being electrically short-circuited as described above, and are disposed to share one second solder portion 46. Further, the number of the second electrodes 51 is greater than or equal to that of the first electrodes 50, and the number of the first solder portions 45 is greater than that of the second solder portions 46.

<Operation and Effects>

Here, the operation and effects of the semiconductor device according to the first embodiment will be described with reference to FIGS. 7 and 8. The description is focused on the operation of the controller 13, and specific examples will be described.

Figure 7:
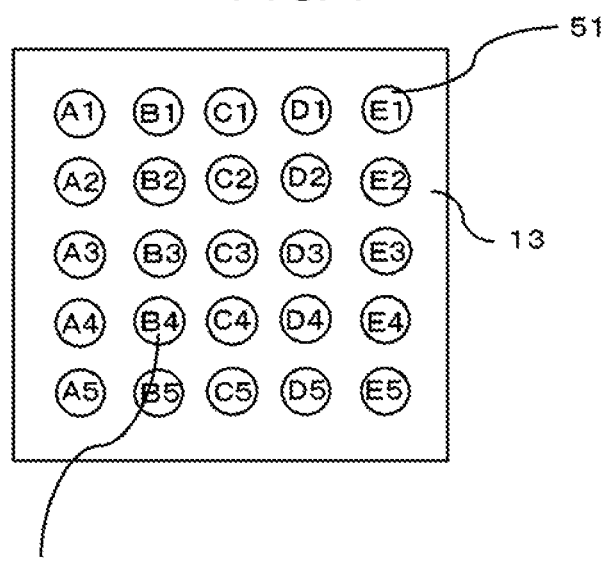
FIG. 7 is a diagram illustrating an example in which first electrodes and second electrodes of the semiconductor device according to the first embodiment are arranged.

An example of assigning the first electrodes 50 and the second electrodes 51 is illustrated in FIG. 7. In FIG. 7, pin numbers are arbitrarily defined, and are designated as either propagating the signal of the controller 13 or being connected to the GND potential. FIG. 8 illustrates a table in which the numbers of the first electrodes 50 and the second electrodes 51 are associated with names of functions.

A specific example will be described with reference to FIGS. 7 and 8. Electrodes A1, A2, A4, A5, B1, B5, D1, D5, E1, E2, E4, and E5 of the controller 13 are the second electrodes 51 connected to a GND with the mounting substrate 11. The second electrodes 51 connected to the GND are connected to the mounting substrate 11 via the second solder portion 46. On the other hand, electrodes A3, B2, B3, B4, C1, C2, C3, C4, C5, D2, D3, D4, and E3 of the controller 13 are the first electrodes to which different signals are assigned. The first electrodes 50 are connected to the mounting substrate 11 via the first solder portions 45 which are different from each other.

The second electrodes 51 are shared by the second solder portion 46 on a first surface 11a of the mounting substrate 11. The range shared by the second solder portion 46 can be appropriately adjusted. One second solder portion 46 has a larger bonding area with the mounting substrate 11 as compared with one first solder portion 45, and can more firmly bond the mounting substrate 11 to the package substrate 41. In FIG. 8, four sets of second electrodes 51 corresponding to groups A1-A2-B1, A4-A5-B5, D1-E1-E2, and D5-E4-E5 are shared by the second solder portions 46, respectively.

Figure 9:
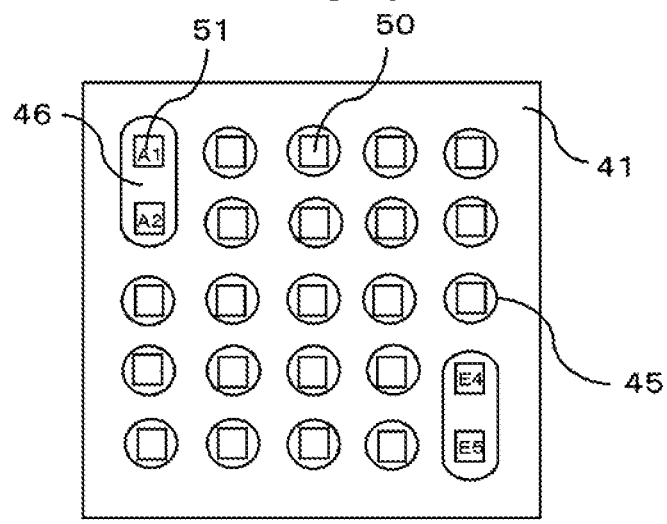
FIG. 9 is a first image diagram illustrating arrangement of first solder portions and second solder portions of the semiconductor device according to the first embodiment.

It should be noted that the above description is merely an example, and only some of the second electrodes such as A1-A2 or E4-E5 may be shared by the second solder portion 46 as illustrated in FIG. 9. In FIG. 9, the mounting substrate 11 is not presented.

Figure 10:
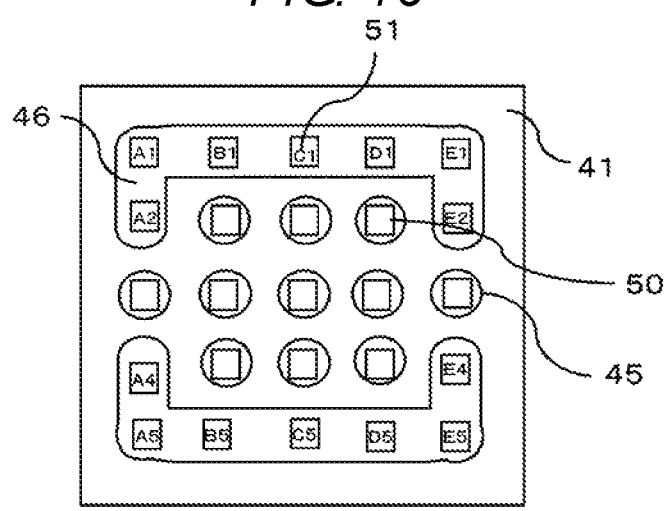
FIG. 10 is a second image diagram illustrating arrangement of the first solder portions and the second solder portions of the semiconductor device according to the first embodiment.

In addition, when the electrodes C1 and C5 are the second electrodes 51 to which the GND potential is applied, as illustrated in FIG. 10, the second electrodes 51 corresponding to the groups A1-A2-B1-C1-D1-E1-E2 and A4-A5-B5-C5-D5-E4-E5 may be shared by the second solder portions 46, respectively. In FIG. 10, the mounting substrate 11 is not also presented.

As described above, as the bonding area of the second solder portion 46 becomes larger or the number of the second solder portions 46 is greater, the bonding between the mounting substrate 11 and the package substrate 41 becomes stronger. In addition, although the stress tends to concentrate on the four corners of the package substrate 41, all of the second solder portions 46 is not necessarily to be provided in the four corners, but may be provided only in a part. Further, a plurality of second electrodes 51b not positioned at the four corners may be shared by the second solder portion 46. Moreover, the second solder portion 46 may be provided at a position corresponding to the outer peripheral portion of the electrode group 52 such that a distance from the center (center of point symmetry) of the package substrate 41 to the farthest point of the second solder portion 46 is equal to or longer than a distance from the center of the package substrate 41 to the farthest point of the first solder portion 45.

However, even when all the outermost peripheral portions of the electrodes arranged in the lattice pattern form the second electrodes 51 to which the GND potential is applied, it is not desirable to share all of them with the second solder portion 46. The reason is that the space between the package substrate 41 and the mounting substrate 11 is hermetically sealed by the second solder portion 46 in this case, so that heat is trapped inside the hermetically sealed space or an internal air is expanded, and thus a pressure is applied to the package substrate 41 and the mounting substrate 11.

In the description of the embodiment, the embodiment is applied to the controller 13 as an example. However, the embodiment is applicable not only to the controller 13 but also to a BGA-type semiconductor package component, such as the NAND memory 12 illustrated in FIG. 3, to which the mounting substrate and the package substrate are connected.

Next, the operation of a semiconductor device 13 according to a comparative example will be described.

Figure 11:
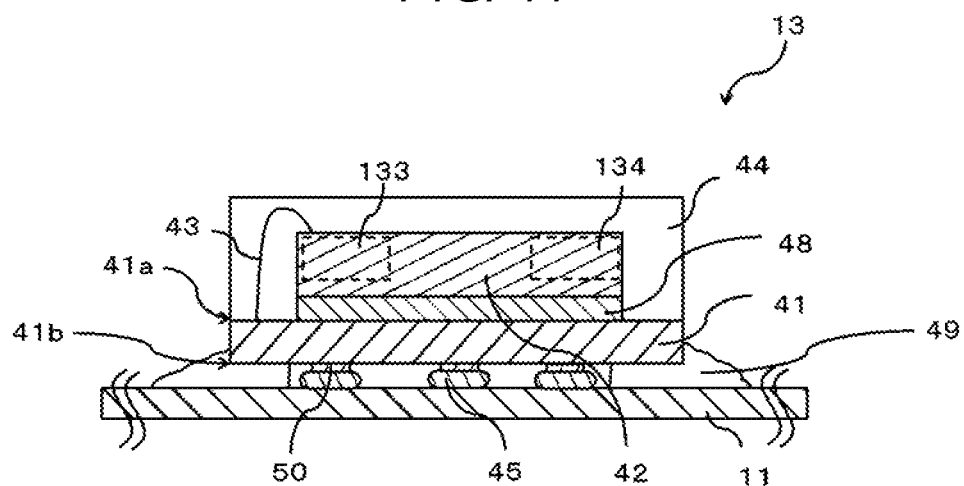
FIG. 11 is a cross sectional view illustrating a state where a controller of a semiconductor device according to a comparative example is mounted.
Figure 12:
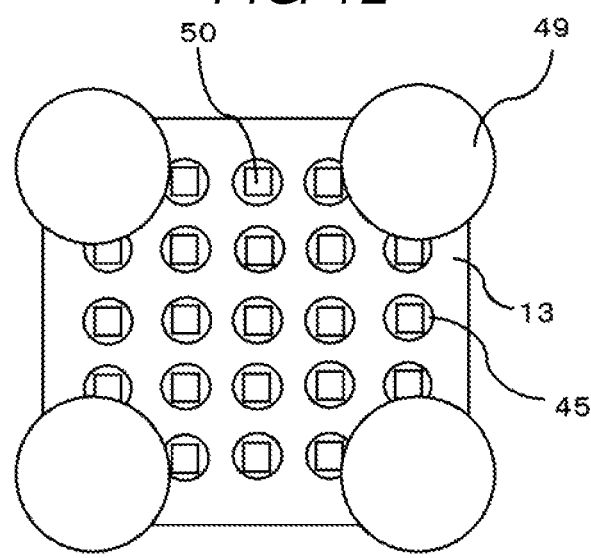
FIG. 12 is a top-view of the controller with the package substrate of the comparative example depicted in a transparent manner so as to illustrate the positional relationship between electrodes and solder portions.

FIG. 11 is a cross sectional view illustrating a state where a controller 13 according to the comparative example is mounted. FIG. 12 is a top view illustrating a case where the controller 13 according to the first embodiment is mounted on the mounting substrate 11. In FIG. 12, the configuration on the front surface 41a of the package substrate 41 and the mounting substrate 11 will not be presented similarly to FIG. 6 for convenience of description. Further, the package substrate 41 is transparently illustrated so as to easily recognize the positional relationship between the first solder portion 45 and the first electrode 50.

The semiconductor device 13 according to the comparative example differs in structure from the semiconductor device 1 according to the first embodiment in that the second solder portion is not provided and four corners of the controller 13 are covered with a reinforcing adhesive 49.

In the semiconductor device 13, the reinforcing adhesive 49 is applied to corner portions of the package substrate 42 in some cases so as prevent cracks from occurring at contacts soldered to the mounting substrate 11 or the package substrate 42. In this case, although the occurrence of the cracks in the mounting substrate or the semiconductor package can be prevented by the reinforcing adhesive 49, the cost increases due to the use of the reinforcing adhesive 49. In addition, the process further includes a heating step for adhering, resulting in a decrease in yield due to the increase in the number of steps. Moreover, if once the reinforcing adhesive 49 is applied, it is difficult to remove it, and in a case of melting it by heating, the mounting substrate 11 may be impaired, resulting in causing the damage of the semiconductor device 13.

On the other hand, in the semiconductor device 1 according to the first embodiment, the mounting substrate 11 and the package substrate 42 are bonded to each other by increasing the area of the solder portion instead of using the reinforcing adhesive 49. More specifically, the second solder portions 46 are formed to be connected to the plurality of second electrodes 51 through which no signal flows, and thus the mounting substrate 11 and the package substrate 42 are more firmly bonded to each other. Thus, the semiconductor device 1 is improved in mounting reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a mounting substrate including an interface connectable with a host;
   a surface-mounted component mounted on the mounting substrate and having a signal electrode group having a plurality of signal electrodes through which data or control signals are transmitted and a ground electrode group having a plurality of ground electrodes electrically connected to ground, wherein the signal electrodes and the ground electrodes are arranged in a lattice pattern in the surface-mounted component, and three or more of the ground electrodes are continuously arranged in a low or column direction of the lattice pattern at an outer periphery of the lattice pattern;
   a first solder portion positioned individually between one of the signal electrodes in the signal electrode group and the mounting substrate; and
   a second solder portion positioned commonly between the three or more of the ground electrodes in the ground electrode group and the mounting substrate, the second solder portion having a larger contact area with the mounting substrate than the first solder portion.

2. The semiconductor device according to claim 1, wherein
   four of the ground electrodes in the ground electrode group are positioned at four corners of the lattice pattern, respectively.

3. The semiconductor device according to claim 1, wherein
   the first solder portion is one of a plurality of first solder portions, each of the first solder portions being positioned between one of the signal electrodes in the signal electrode group and the mounting substrate, and
   the second solder portion is one of a plurality of second solder portions, each of the second solder portions being positioned between three or more of the ground electrodes in the ground electrode group that are arranged in low or column direction of the lattice pattern at an outer periphery of the lattice pattern and the mounting substrate.

4. The semiconductor device according to claim 3, wherein
   the number of the first solder portions is larger than the number of the second solder portions.

5. The semiconductor device according to claim 1, wherein
   the surface-mounted component is a ball-grid-array semiconductor package.

6. The semiconductor device according to claim 1, wherein the surface-mounted component is a land-grid-array semiconductor package.

7. The semiconductor device according to claim 1, wherein
a first one of the ground electrodes is positioned at a corner of the lattice pattern, a second one of the ground electrodes is positioned adjacent to the first one of the ground electrodes in a column direction of the lattice pattern, and a third one of the ground electrodes is positioned adjacent to the first one of the ground electrodes in a row direction of the lattice pattern, and
the second solder portion is positioned commonly between the first, second, and third ones of the ground electrodes and the mounting substrate.

8. The semiconductor device according to claim 1, wherein
an entire peripheral row or column of the lattice pattern consists of three or more of the ground electrodes, and includes none of the signal electrodes.

9. The semiconductor device according to claim 1, wherein all of the signal electrodes and all of the ground electrodes have a rectangular shape.

10. A semiconductor device comprising:
a mounting substrate including an interface connectable with a host;
a non-volatile semiconductor memory chip mounted on the mounting substrate;
a surface-mounted component including a memory controller for the non-volatile semiconductor memory chip, mounted on the mounting substrate and having a signal electrode group having a plurality of signal electrodes through which data or control signals are transmitted and a ground electrode group having a plurality of ground electrodes electrically connected to ground, wherein the signal electrodes and the ground electrodes are arranged in a lattice pattern in the surface-mounted component, and three or more of the ground electrodes are continuously arranged in a low or column direction of the lattice pattern at an outer periphery of the lattice pattern;
a first solder portion positioned individually between one of the signal electrodes in the signal electrode group and the mounting substrate; and
a second solder portion positioned commonly the three or more of the ground electrodes in the ground electrode group and the mounting substrate, the second solder portion having a larger contact area with the mounting substrate than the first solder portion.

11. The semiconductor device according to claim 10, wherein
four of the ground electrodes in the ground electrode group are positioned at four corners of the lattice pattern, respectively.

12. The semiconductor device according to claim 10, wherein
the first solder portion is one of a plurality of first solder portions, each of the first solder portions being positioned between one of the signal electrodes in the signal electrode group and the mounting substrate, and
the second solder portion is one of a plurality of second solder portions, each of the second solder portions being positioned between three or more of the ground electrodes in the ground electrode group that are arranged in a low or column direction of the lattice pattern at an outer periphery of the lattice pattern and the mounting substrate.

13. The semiconductor device according to claim 12, wherein
the number of the first solder portions is larger than the number of the second solder portions.

14. The semiconductor device according to claim 10, wherein
the surface-mounted component is a ball-grid-array semiconductor package.

15. The semiconductor device according to claim 10, wherein
the surface-mounted component is a land-grid-array semiconductor package.

16. The semiconductor device according to claim 10, wherein
a first one of the ground electrodes is positioned at a corner of the lattice pattern, a second one of the ground electrodes is positioned adjacent to the first one of the ground electrodes in a column direction of the lattice pattern, and a third one of the ground electrodes is positioned adjacent to the first one of the ground electrodes in a row direction of the lattice pattern, and
the second solder portion is positioned commonly between the first, second, and third ones of the ground electrodes and the mounting substrate.

17. The semiconductor device according to claim 10, wherein
an entire peripheral row or column of the lattice pattern consists of three or more of the ground electrodes, and includes none of the signal electrodes.

18. The semiconductor device according to claim 10, wherein all of the signal electrodes and all of the ground electrodes have a rectangular shape.

* * * * *